(12) United States Patent
Alemán et al.

(10) Patent No.: US 11,862,265 B2
(45) Date of Patent: Jan. 2, 2024

(54) MECHANICAL MEMORY AND TUNABLE NANO-ELECTROMECHANICAL SYSTEMS (NEMS) RESONATOR

(71) Applicant: University of Oregon, Eugene, OR (US)

(72) Inventors: Benjamín J. Alemán, Eugene, OR (US); David J. Miller, Eugene, OR (US)

(73) Assignee: University of Oregon, Eugene, OR (US)

( * ) Notice: Subject to any disclaimer, the term of this patent is extended or adjusted under 35 U.S.C. 154(b) by 214 days.

(21) Appl. No.: 17/613,192

(22) PCT Filed: May 27, 2020

(86) PCT No.: PCT/US2020/034750
§ 371 (c)(1),
(2) Date: Nov. 22, 2021

(87) PCT Pub. No.: WO2020/243201
PCT Pub. Date: Dec. 3, 2020

(65) Prior Publication Data
US 2022/0238172 A1    Jul. 28, 2022

Related U.S. Application Data

(60) Provisional application No. 62/853,161, filed on May 27, 2019.

(51) Int. Cl.
*G11C 23/00*     (2006.01)
*G02B 26/00*     (2006.01)
*G11C 11/56*     (2006.01)

(52) U.S. Cl.
CPC ............ *G11C 23/00* (2013.01); *G02B 26/001* (2013.01); *G11C 11/56* (2013.01)

(58) Field of Classification Search
CPC ........ G11C 23/00; G11C 11/56; G02B 26/001
See application file for complete search history.

(56) References Cited

U.S. PATENT DOCUMENTS 6,922,272 B1 * 7/2005 de Groot ............. B81C 1/00666
359/290
2005/0242904 A1  11/2005 Lutz
(Continued)

OTHER PUBLICATIONS

IEEE MEMS 2022, Tokyo, JAPAN Jan. 9-13, 2022; Nanoelectromechanical Memories Basedonnonlinear 2D MoS2 Resonators Pengcheng Zhang et al.(Year: 2022).*
(Continued)

*Primary Examiner* — Min Huang
(74) *Attorney, Agent, or Firm* — LUMEN PATENT FIRM

(57) ABSTRACT

A method of tuning a resonant frequency of a nano-electromechanical systems (NEMS) drum device is performed by applying a gate voltage between the drum membrane [100] and a back gate [104] to alter the resonant frequency of the membrane to a desired frequency; photoionizing the drum membrane with a laser to detune the membrane resonant frequency to a ground state frequency; and releasing the gate voltage to set the membrane to the desired resonant frequency. The method provides the basis for various applications including NEMS memory and photodetection techniques. The NEMS device may be implemented as a graphene/hBN membrane [100] suspended on a SiO2 layer [102] deposited on a Si substrate [104].

10 Claims, 13 Drawing Sheets

(56) References Cited

U.S. PATENT DOCUMENTS

2013/0135620 A1* 5/2013 De Groot ................ G01L 1/103
356/445
2015/0300999 A1 10/2015 Andreucci
2020/0174192 A1* 6/2020 Hasan .................... G02B 6/136

OTHER PUBLICATIONS

Cai et al. Efficient Photoinduced Charge Accumulation in Reduced Graphene Oxide Coupled with Titania Nanosheets to Show Highly Enhanced and Persistent Conductance. Appl. Mater. Interf. 2015, 11436-43.
Kim et al. Focused-Laser Enabled p—n Junctions in Graphene Field-Effect Transistors. ACS Nano 7(7) 2013 5850-5857.
Choi et al. Photoelectric Memory Effect in Graphene Heterostructure Field-Effect Transistors Based on Dual Dielectrics. ACS Photonics 2018, 5: 329-336.
Miller et al. Non-volatile rewritable frequency turning of a nonelectromechanical resonator using photoinduced doping. Nano Letters 20(4) 2020 2378-2380.

* cited by examiner

MECHANICAL MEMORY AND TUNABLE NANO-ELECTROMECHANICAL SYSTEMS (NEMS) RESONATOR

FIELD OF THE INVENTION

The present invention relates generally to nanoelectromechanical systems (NEMS) resonators. More specifically, it relates to tunable NEMS resonators and associated methods.

BACKGROUND OF THE INVENTION

Nanoelectromechanical (NEMS) resonators have been used as highly sensitive detectors of mass, charge, and displacement. Much like their electronic device counterparts, the potential applications of NEMS resonators intensifies and expands when resonators are built up into large-scale arrays and networks of resonators. However, these applications require a high degree of precision and control over the frequency and coupling of each NEMS device. To realize these applications, this tuning must be persistent (i.e. has memory), reversible, and tunable over a large range. It must also be fast and scalable to be useful in large arrays. Although there have been numerous attempts at NEMS tuning, each has been accompanied by significant drawbacks and challenges. Active tuning methods such as electrostatic gating or a local heating are reversible and can achieve a large tuning range, but these active methods are not persistent; for instance, a gated NEMS devices returns to the ungated frequency once the gate is removed. Moreover, to maintain the tuned frequency, active tuning requires a continuous, separate external force for each individual NEMS resonator, making them impractical for integration into large arrays. Passive methods permanently modify the NEMS structure, for example by adding or removing mass or thermal buckling the resonator. Although passive tuning techniques have achieved persistent tunability, once set to an initial value, the resonator frequency cannot be controllably changed, even to offset frequency drift. Only a few NEMS tuning approaches have combined persistence and reversibility. These include mass electromigration along suspended carbon nanotubes and etching/depositing of mass with a focused ion beam, but these techniques require an electron microscope and in situ nanomanipulation, which severely impedes practicality and scalability, especially for arrays of resonators. Moreover, these tuning schemes suffers from poor frequency resolution, a limited tuning range (~10%), slow speed, and limited cyclability. Thus, a viable solution for frequency tuning of NEMS resonators remains an ongoing, unmet challenge.

SUMMARY OF THE INVENTION

The present description discloses a persistent, rewritable, scalable, and high-speed frequency tuning method for NEMS implemented, for example, in graphene. The method uses a focused laser and two shared electrical contacts to simultaneously apply optical and electrostatic fields to locally photodope individual resonators in less than a millisecond. After the fields are removed, the trapped charge created by this process persists and electrostatically strains the resonator, shifting its frequency. The phototuning approach achieves frequency tuning of over 550% and a persistence lifetime (memory) of several days, and can write and erase the frequency indefinitely with a high degree of tuning precision (~0.1%). By providing a facile means to locally address the strain of a NEMS resonator, the phototuning approach provides the basis for fully programmable large-scale NEMS lattices and networks.

The invention provides, in one aspect, a method of operation of a nano-electromechanical systems (NEMS) drum resonator device, characterized in the use of the photoelectric memory effect to achieve high-speed, bidirectional, persistent tuning of resonant states of the NEMS drum. This technique may be used to realize a NEMS resonator memory device. This device is an example of a multi-state memory element. As opposed to a binary memory with just two states per element, a multi-state memory can hold many more states per element. In one implementation, the device has 10,000-100,000 distinct memory states, equivalent to a 16-bit binary memory.

A scanning interferometer may be used to transduce and image an entire array of drumheads, thereby providing a large memory array.

In one aspect, the invention provides a method of storing a multi-state value (i.e., setting a resonant frequency) in a nano-electromechanical systems (NEMS) drum device, the method comprising:
applying a gate voltage between the drum membrane and a back gate to alter the resonant frequency of the membrane to a desired frequency;
photoionizing the drum membrane with a laser to detune the membrane resonant frequency to a ground state frequency;
releasing the gate voltage to set the membrane to the desired resonant frequency.

The nano-electromechanical systems (NEMS) drum device in one implementation comprises a graphene/hBN membrane suspended on a $SiO_2$, layer deposited on a Si substrate. The method may also include measuring the drumhead resonance frequency via optical interferometry to read the desired resonant frequency to which the membrane is set. The method may also include setting the gate voltage to zero and illuminating the drum membrane with a laser to reset the drum device. In some implementations, the nano-electromechanical systems (NEMS) drum device is an element of an array of nano-electromechanical systems (NEMS) drum devices.

In another aspect, the invention provides a method for photodetection using a nano-electromechanical systems (NEMS) drum device. Light builds up charge which then strains the resonator. The total accumulated frequency shift is a measure of the total accumulated light exposure through photo induced ionization. Thus, the invention provides a method for photodetection of light with a nanoelectromechanical (NEMS) resonator, the method comprising:
applying a gate voltage between the drum membrane and a back gate,
exposing the membrane to light to produce photoionization of the drum membrane such that a resulting charge alters the membrane resonant frequency,
turning off the light and releasing the gate voltage to set the resonant frequency of the membrane to a predetermined frequency;
exposing the drum membrane to the light to produce photoionization of the drum membrane such that a resulting charge alters the membrane resonant frequency;
measuring the drumhead resonance frequency and comparing it to the predetermined frequency to determine total accumulated exposure of the drumhead to the light.

The nano-electromechanical systems (NEMS) drum device in one implementation comprises a graphene/hBN membrane suspended on a SiO₂, layer deposited on a Si substrate. Exposing the membrane to laser light is performed while the gate voltage continues to be applied between the drum membrane and the back gate. The method may also include setting the gate voltage to zero and illuminating the drum membrane with a laser to reset the drum device. In some implementations, the nano-electromechanical systems (NEMS) drum device is an element of an array of nano-electromechanical systems (NEMS) drum devices.

These and other aspects and applications of the invention will be further evident from the following description and associated drawings.

DETAILED DESCRIPTION

Figure 1A:
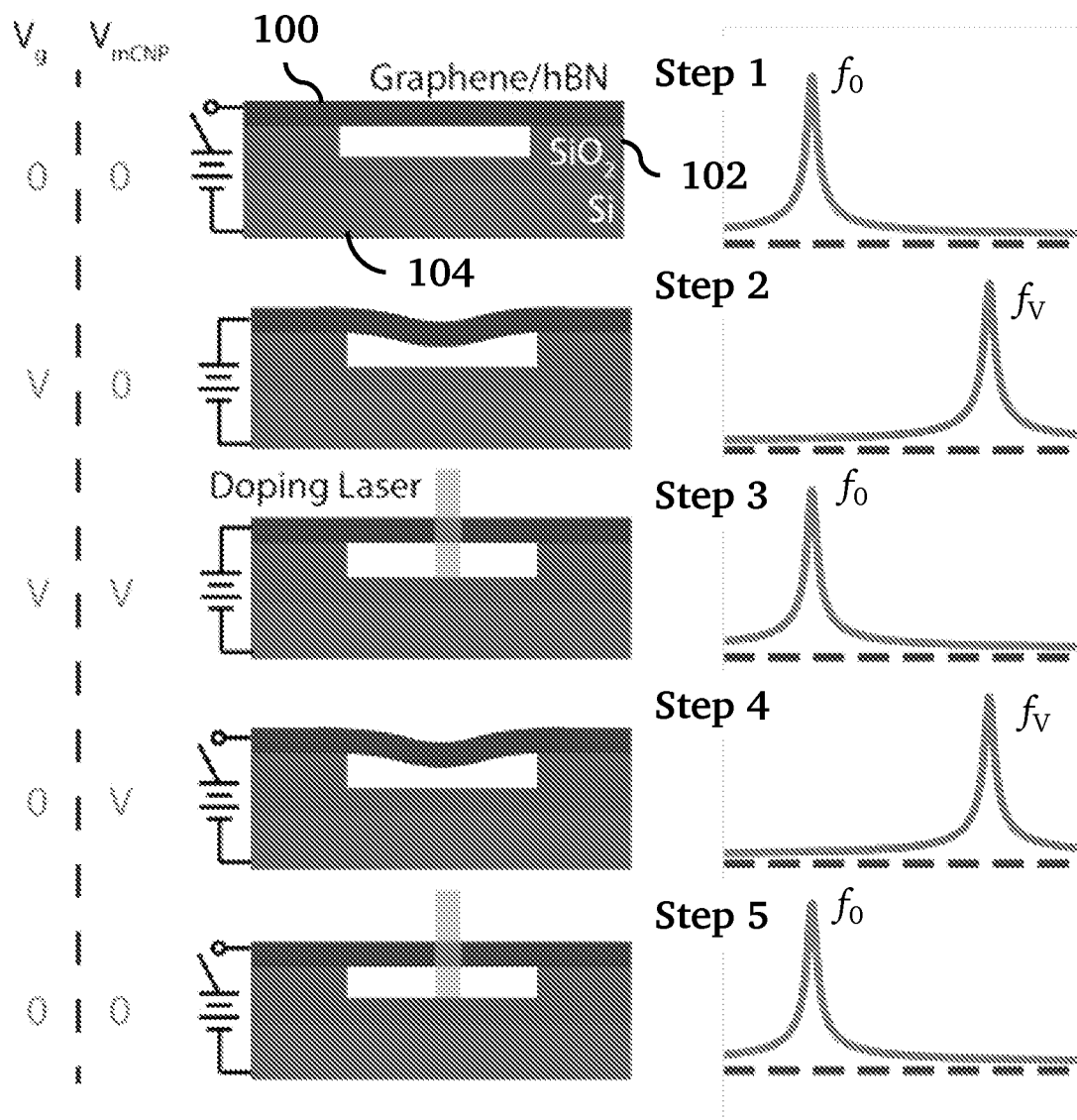
FIG. 1A illustrates steps of a method of setting a resonant frequency of a NEMS drumhead device, according to an embodiment of the invention.

In an embodiment of the invention, a reversible and long-lived frequency tuning of NEMS membrane resonators is provided. In one example implementation, reversible and long-lived frequency tuning of graphene and graphene/hexagonal boron nitride (hBN) NEMS membrane resonators is provided. The technique uses spatially resolved photodoping of a membrane to generate locally-trapped, rewritable electrostatic charge which tensions the membrane and shifts its resonant frequency in a way equivalent to a local back gate. To phototune the frequency of an individual membrane—that is, to set or change the frequency through photodoping—a bias is applied to a back-gate while focusing a laser onto the individual, suspended membrane of interest. The method is illustrated in the steps of FIG. 1A. The NEMS device has a graphene/hBN membrane 100 suspended on a SiO₂, layer 102 deposited on a Si substrate 104 that serves as a back gate. Contacts are provided to apply voltage bias between the graphene membrane and Si substrate. Writing and erasing the hBN/graphene NEMS memory is achieved as follows:

Step 1: Initially, the laser and bias are both off, and the resonator will be at a frequency $f_0$, which is typically on the order of 10 MHz.

Step 2: With the laser off, apply a gate voltage $V_g$ between the graphene/hBN and the silicon back gate to tension the graphene/hBN membrane and increase (i.e., blue-shift) its frequency from $f_0$ to $f_V$. The value of $V_g$ is selected to achieve the desired frequency $f_V$ that will result from the subsequent photo-doping process (steps 2-3).

Step 3: While continuing to apply $V_g$, shine a laser on the graphene/hBN membrane to photoionize defects in hBN, doping the graphene, thereby removing the tension induced by the back-gate and detuning the resonance frequency away from $f_V$ toward $f_0$. Given enough laser dose, the phototuning saturates, and the frequency approaches $f_0$. Any visible light laser can be used to detune the membrane, but a blue laser (which has a higher energy per photon), and a higher power, has a faster detuning rate.

Step 4: With the laser off, turn off the bias gate voltage $V_g$. The graphene/hBN membrane will then shifts back to the frequency $f_V$ set in Step 2. The final phototuned frequency $f_V$ is determined by the initial value of $V_g$, which we will call the doping potential, $V_d$, and the illumination dose.

Steps 1-4 complete the phototuning "write" function. The graphene/hBN membrane will remain at this frequency for several days with little or no change in frequency. This completes the memory writing operation.

The drumhead state (i.e., its resonant frequency $f_V$) may be read by measuring the drumhead resonance frequency via optical interferometry.

Step 5: The frequency can be reset back to $f_0$ (i.e., the memory erased) by zeroing the doping potential (i.e., setting $V_g$=0 V) and illuminating the membrane with the laser.

In the absence any external bias, the memory of the written frequency state $f_V$ is long-lived, lasting several days to weeks with less than 1% change in $f_V$ (a high degree of non-volatility). The writing/erasing process reaches speeds exceeding 1 GHz/s, which can tune a typical resonator by a full line-width in ~100 μs, and has a tuning range of at least ~550%. The device can be rewritten a seemingly unlimited number of times with no observable degradation to the photo-tuning effect and with greater than 99% reproducibility. Furthermore, the spatial resolution of the tuning is diffraction limited, so it can address and write single micron-scale membranes and is scalable to large, chip-scale NEMS arrays which operates with only a single back-gate.

The above steps can be used with slight modification to provide a method for photodetection. Incident radiation to be detected builds up charge which then strains the resonator. The total accumulated frequency shift of the resonator can be measured to determine the total accumulated light exposure through photo induced ionization. More specifically, this method for photodetection of light with a nano-electromechanical (NEMS) resonator has the following steps: applying a gate voltage between the drum membrane and a back gate, as in Step 2 above; turning on a light to expose the membrane to light to produce photoionization of the drum membrane such that a resulting charge alters the membrane resonant frequency, as in Step 3 above; turning off the light and releasing the gate voltage to set the resonant frequency of the membrane to a predetermined frequency, as in Step 4 above; exposing the drum membrane to the light to be detected to produce photoionization of the drum membrane such that a resulting charge alters the membrane resonant frequency, as in Step 5 above; and measuring the altered drumhead resonance frequency and comparing it to the predetermined frequency to determine total accumulated exposure of the drumhead to the light to be detected.

Figure 1B:
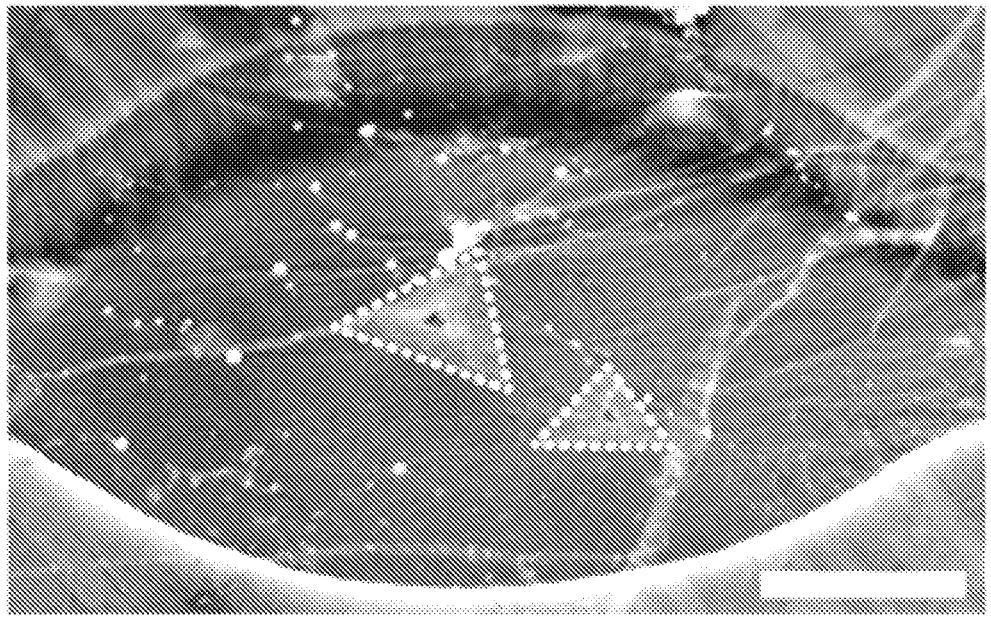
FIG. 1B and FIG. 1C are scanning electron microscope images of a 4.5 μm Gr/hBN drumhead used to implement a method according to an embodiment of the invention.
Figure 1C:
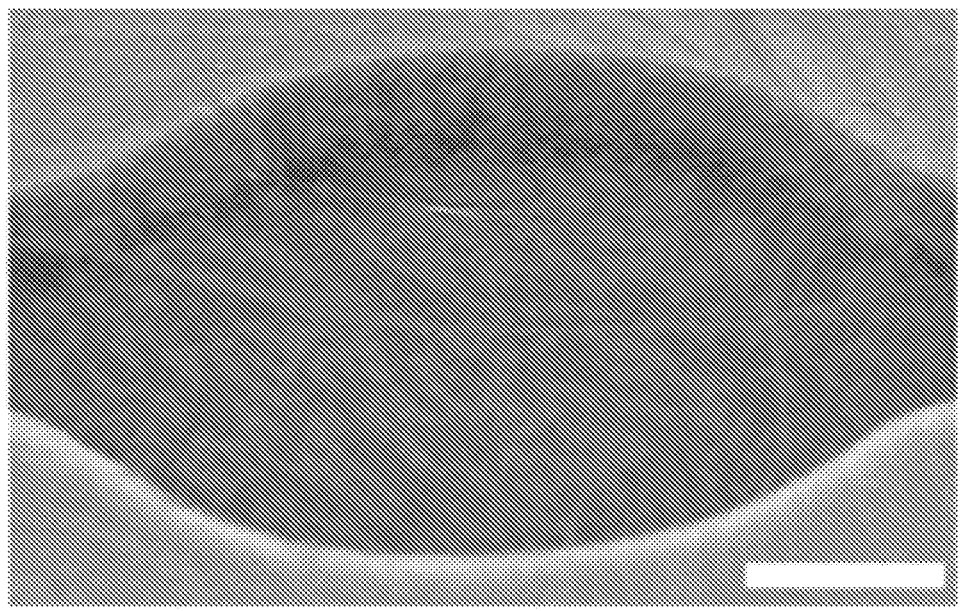

Example NEMS resonator devices and methods will now be illustrated in detail, together with results of experiments to characterize their properties. The phototuning effect was observed in NEMS membranes made from both graphene and a graphene/hBN heterostructure (gr/hBN). The devices are composed of a 2D sheet suspended over a ~5 μm diameter circular cavities etched into $SiO_2$ on top of degenerately-doped silicon and top-contacted by Ti/Pt electrodes, as illustrated in the SEM images of FIG. 1B and FIG. 1C. These images show a 4.5 μm Gr/hBN drumhead with venting trenches on the side. Small multilayer islands of h-BN are visible on the surface. Scale=1 μm. The triangles seen in FIG. 1B are regions of multilayer hBN. The graphene and hBN were both synthesized by CVD.

Figure 1D:
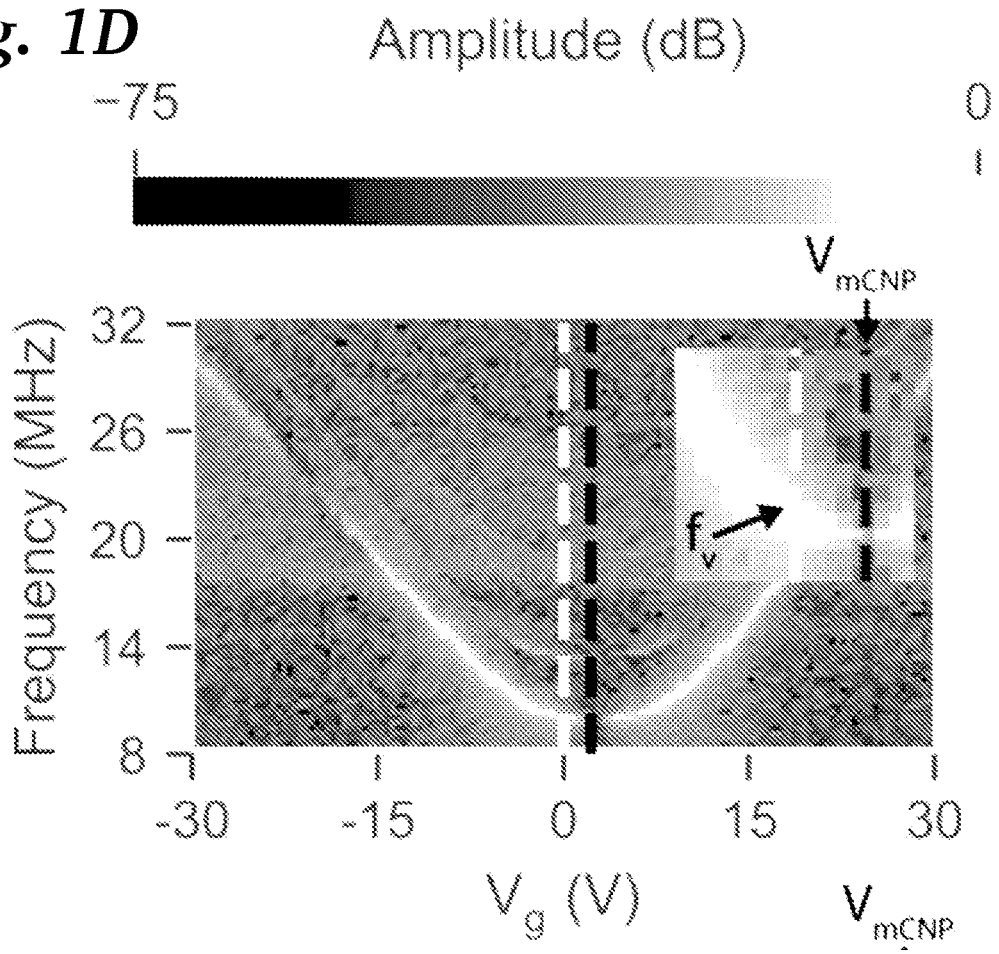
FIG. 1D and FIG. 1E show electrostatic tuning curves for a Gr/hBN drumhead resonator before phototuning and after phototuning, respectively.
Figure 1E:
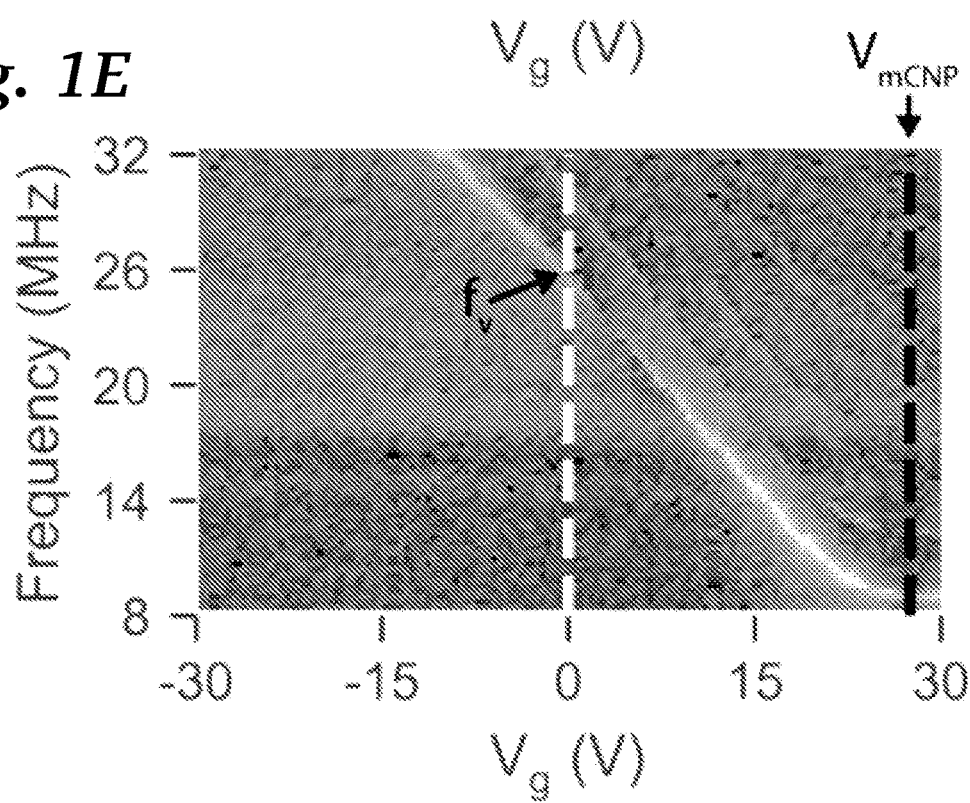
Figure 1F:
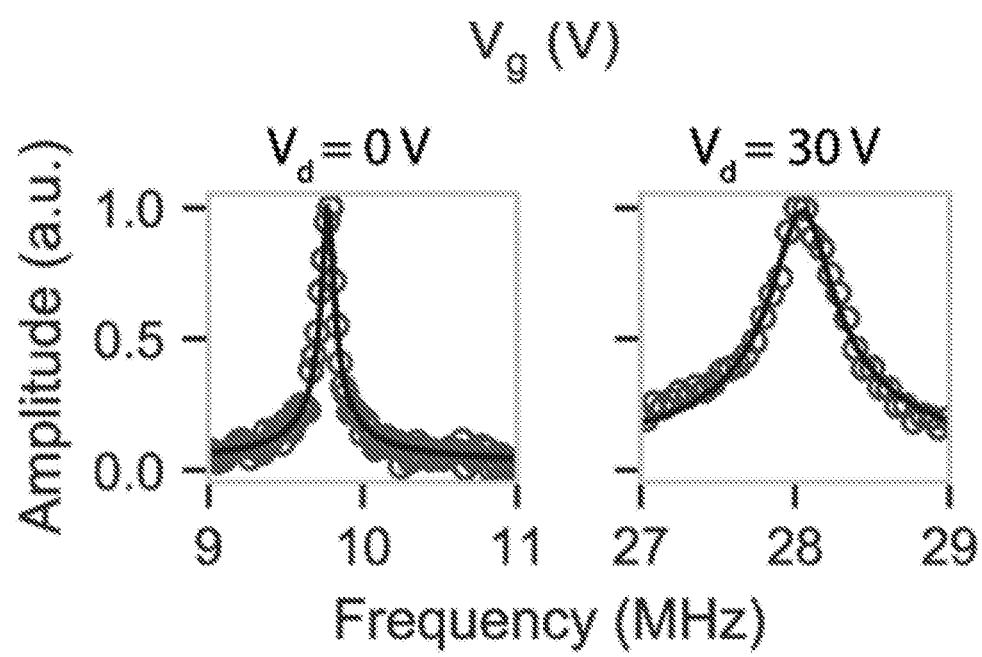
FIG. 1F shows graphs of the resonant response of the resonators, according to an embodiment of the invention.

The phototuning effect amplitude-frequency spectra of the resonators is shown in FIG. 1F, which shows graphs of the resonant response with $V_d=0$ (left at 9.8 MHz) and $V_d=30$ (right, 28 MHz), indicating a resonance frequency shift tuning range of 250%. To obtain these spectra, motion of the membranes is driven by applying an a.c. voltage to the back gate, and measure the motion with scanning optical interferometry and lock-in amplification. The interferometer is operated at a low power of <10 μW and at 633 nm to minimize unwanted phototuning.

FIG. 1D and FIG. 1E show electrostatic tuning curves for a Gr/hBN drumhead resonator prior to phototuning and after phototuning, respectively, with $V_d=30$ V. These show tunability of ~200% for a 15 V gate potential. The charge neutrality is located slightly above 0 V. The overall shape of the tuning curves remains the same in all cases but the frequency minimum shifts to the gate voltage during photodoping. These gate-sweep spectrograms are obtained by recording frequency spectra while sweeping a d.c. gate voltage $V_g$ (typically between ±30 V). We denote the minimum resonance frequency as $f_{min}$ and its corresponding gate voltage as the mechanical charge neutrality point (mCNP), or $V_{mCNP}$. In a gate sweep, we note that the resonance amplitude vanishes when $V_g=V_{mCNP}$ because the device has an effective zero bias when $V_g=V_{mCNP}$. We observe values of $f_{min}$ between 5 and 15 MHz, quality factors between 10-100, and gate frequency tuning between 200-500%. Undoped values of $V_{mCNP}$ are between 0 and 1 V.

Phototuning causes $V_{mCNP}$, and thus $f_V$, to shift to a value determined by the doping potential, $V_d$. Spectrograms for a gr/hBN device with and without photodoping are shown in FIGS. 1D and 1E, respectively. For this data, the doping potential $V_d$ was set to 0 (un-photodoped) and +30 V (photodoped), and the membrane was illuminated to saturation by rastering a relatively high power (~1 mW/μm²) 445 nm laser over the area of the drumhead. The un-photodoped $V_{mCNP}$ is several-hundred mV (FIG. 1D inset). For the photodoped case, $V_{mCNP}$ saturates close to $V_d$, ~28 V in this case. Thus, the unbiased photodoped resonator behaves as if it were gated with an electrostatic potential of $-V_d$. This potential can be described by the presence of charged defects in the h-BN or the oxide. Although $V_d$ shifts $V_{mCNP}$, the gate-dependence of each mode relative to $V_{mCNP}$ is independent of $V_d$, as seen in FIGS. 1D-1E. This demonstrates that the phototuning process does not alter the mechanical characteristics of the device in a measurable way. As $V_{mCNP}$ shifts, the zero-gate bias frequency $f_V$ also shifts. By changing $V_{mCNP}$ from 0 to 28 V, $f_V$ has been tuned from 9.8 MHz to 28 MHz, giving a tuning range of ~250%. The individual resonance curves for these $f_V$ at $V_g=0$ V are shown in FIG. 1F; the Q of the 28 MHz peak (Q=74) is smaller than that of the 9.8 MHz peak (Q=135), just as in the case of an applied electrostatic back gate. Thus, the overall effect of phototuning is equivalent to an electrostatic back gate. Although the central focus of this work is to harness the phototuning effect, this work reveals that optical probing or driving of 2D NEMS can lead to unintended frequency drift.

Figure 2A:
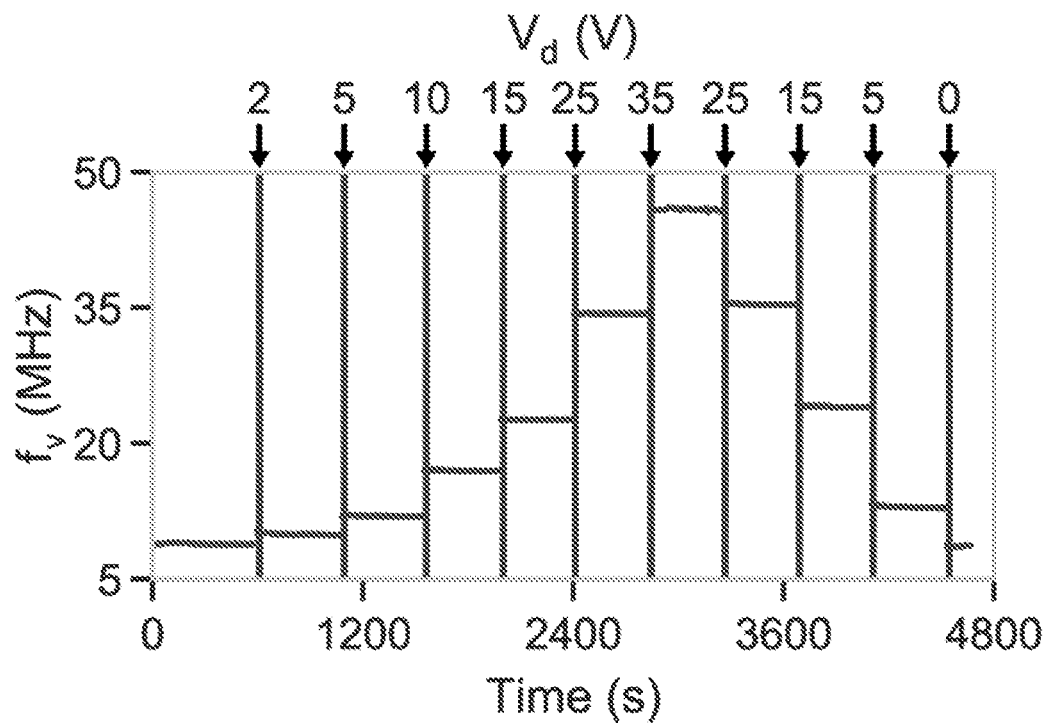
FIG. 2A is a graph of frequency vs. time showing steps of setting the frequency of a resonator, according to an embodiment of the invention.

Setting the value of $f_V$ via phototuning is reversible. To demonstrate this reversibility, we change $f_V$ at discrete time intervals by varying the doping potential. At the beginning of each interval, we perform a high-power (few mW) phototuning write function a single time at a given $V_d$, which takes about 500 ms, and then continuously monitor the $f_V$ for the remainder of the interval, 600 seconds. Increasing $V_d$ step-wise from 0 to 35 V (as seen in FIG. 2A), $f_V$ takes on fixed, stable values that increase from 7 MHz up to 45 MHz. When we decrease $V_d$ step-wise back to 0 V, $f_V$ goes back to 7 MHz. We note that there is some hysteresis, as $f_V$ is slightly lower during for increasing $V_d$ than decreasing $V_d$, which could be due the different photodoping rates and the relatively short illumination time. However, the erased $f_V$ value (at $V_d=0$V) is reproducible. This data clearly demonstrates that the phototuning of $f_V$ is both reversible and bidirectional. The tuning range of $f_V$ is large, here nearly 550%. For a quality factor of a typical device (Q~100), this tuning range equals 543 resonance linewidths, which is several orders of magnitude larger than previous hybrid tuning methods. We limit the doping potential to 35 V to avoid damage to the mechanical resonators, however larger potentials could be used to achieve an even higher degree of tuning.

Our frequency phototuning method is persistent. FIG. 2A shows steps of setting the frequency in time. A combined high-power optical pulse of ~100 μJ and gate voltage are applied at the times indicated by arrows. The steps in FIG. 2A show that $f_V$ is stable for at least 600 s. To assess the long-term stability of phototuning, we write $f_V$ a single time and then periodically (every hour) measure $f_V$ over 3 days.

Figure 2B:
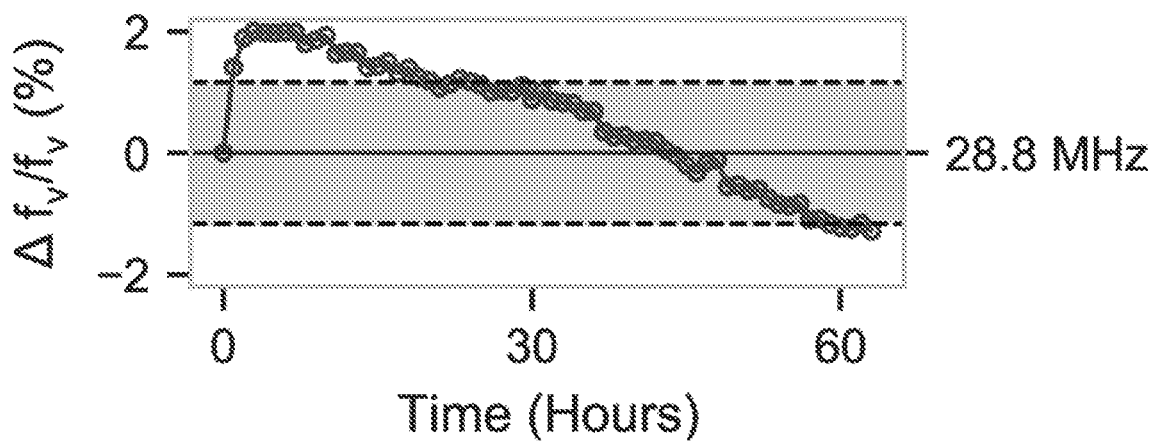
FIG. 2B is a graph of $\Delta f_V/f_V$ vs. time after phototuning, showing stability of the resonator frequency, according to an embodiment of the invention.

The frequency stability with $V_g=0$ V after phototuning 28.8 MHz is shown in FIG. 2B which plots $\Delta f_V/f_V$ after phototuning $f_V$ with a doping potential of 30 V. Initially, $f_V$ is detuned by 2% towards a higher frequency over the course of 2 hours; for a given device, the initial detuning is highly reproducible. Then, the device slowly relaxes and $f_V$ redshifts at a rate of 0.05%/hour. For reference, the mechanical linewidth for our devices is ~2% of the resonance frequency, so the frequency shifts by a linewidth in ~40 hours. The gray band shows the mechanical linewidth corresponding to a Q of 83. This long-lived state does not require an external power supply or gate bias. Therefore, phototuning can replace patterned gate electrodes, even in arbitrarily large resonator arrays. The probe laser will cause some detuning, so in a separate experiment we set $f_V$ and measure it once after 8 days, and still observe a small amount of detuning in addition to warping of the $f_V$ gate dependence. Therefore, additional sources of detuning are present and may include the rearrangement of the trapped charge in the h-BN, strain relaxation (e.g. in folds and edge clamping).

Figure 2C:
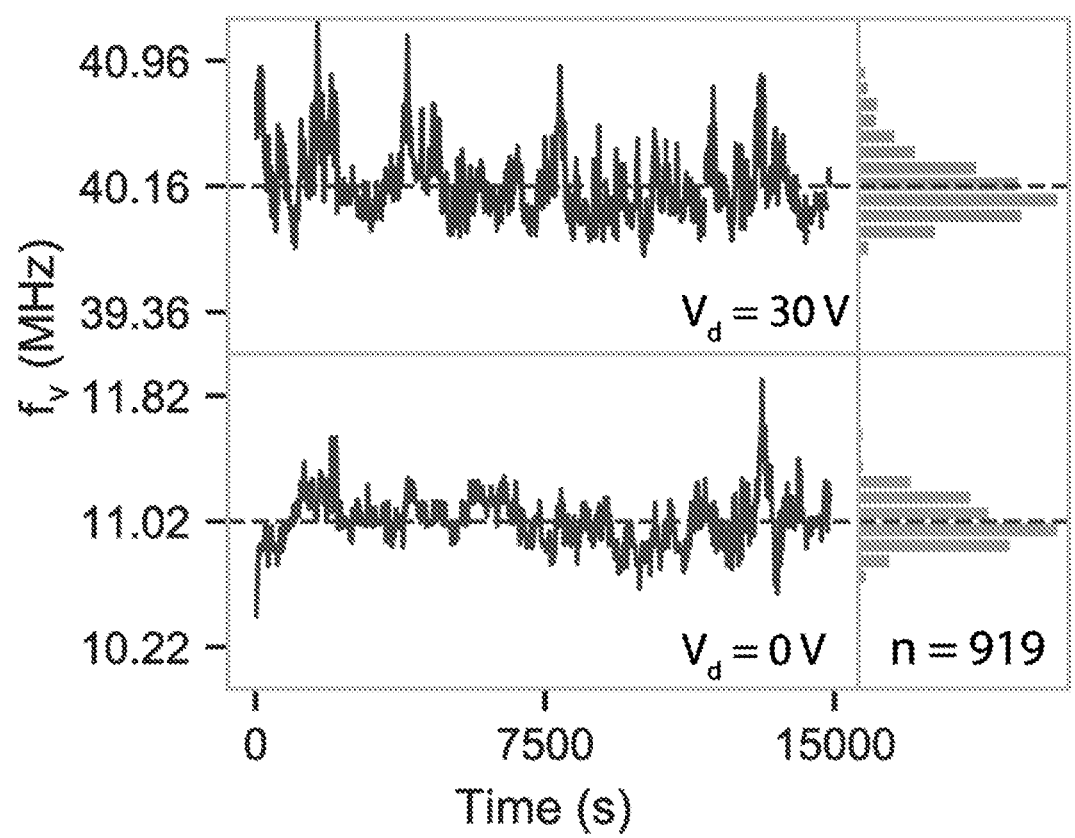
FIG. 2C shows are graphs of results after 1800 erase/write cycles, showing reproducibility for many cycles of photodoping followed by erasure, according to an embodiment of the invention.

The phototuning method can achieve a high degree of frequency tuning repeatability, and can execute an indefinite number of write/erase cycles with no observable change to the phototuning effect or to the mechanical properties of the NEMS device. To test repeatability and cycling performance, we erase the frequency state by phototuning with $V_d=0$ V, then we write $f_V$ with $V_d=30$ V; in both processes, we saturate the illumination. FIG. 2C shows the results after 1800 erase/write cycles, showing reproducibility for 1800 cycles of photodoping with $V_d=30$ V followed by erasure with $V_g$ set at 0 V. The final value is within 0.3 V for both positive and negative photodoping. As measured from the histogram (right of FIG. 2C), the average frequencies of erased and written states are $f_{erase}=11.02\pm0.12$ MHz and $f_{write}=40.16\pm0.16$ MHz. The writing process has a repeatability of 99.5%. The 0.5% repeatability uncertainty is partly due to the phototuning process, but also to other sources of frequency noise and fluctuations common to 2D NEMS, such as adsorbates, heating, and unwrinkling. After 1800 cycles, we did not observe any degradation to the phototuning efficiency or repeatability, or to the device's mechanical properties. We note that the large frequency separation of the written and erased states could easily allow a discrete binary logic state or, given the measured error of 190 kHz, over 150 discrete logic states.

Figure 3A:
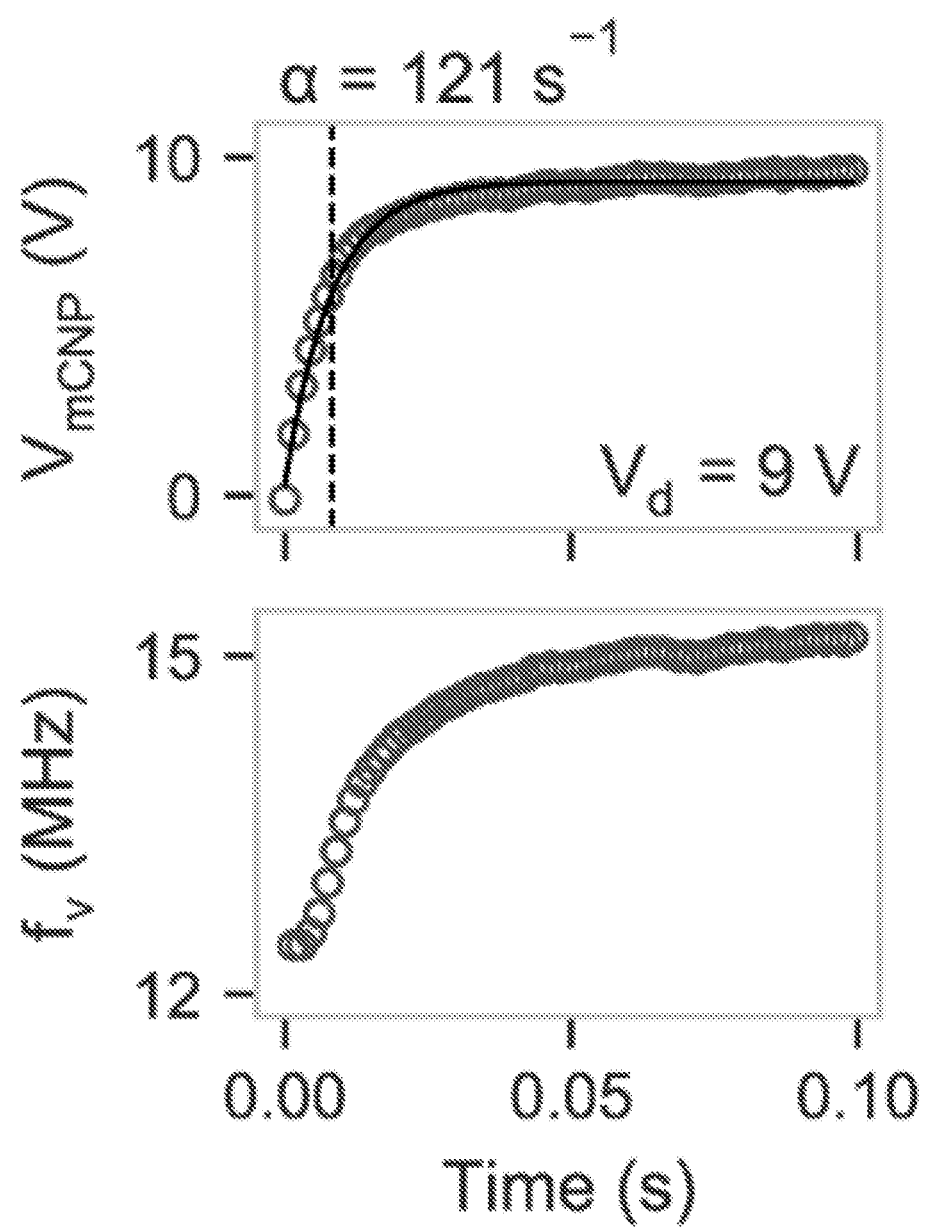
FIG. 3A are graphs showing photodoping curve plots of $V_{mCNP}(t)$ (upper) and $f_V(t)$ (lower), according to an embodiment of the invention.

The temporal rate of the phototuning method is exceptionally fast. The phototuning rate can be inferred from the time-dependence of either $f_V$ or $V_{mCNP}$ during the phototuning process (see Methods). FIG. 3A shows a single photodoping curve plot of $V_{mCNP}(t)$ (upper) and $f_V(t)$ (lower) for $V_d=9$ V, and $P\sim530$ μW/μm² with a 445 nm laser. Both $V_{mCNP}$ and $f_V$ approach steady state values within ~10 ms. Typically, $V_{mCNP}$ saturates very close to $V_d$. Although the saturation level varies by device, it is highly reproducible for a given device. To obtain the doping rate, we model $V_{mCNP}(t)$ with an exponential of the form $$V_{mCNP}(t)=\Delta V(1-e^{-at})+V^0_{mCNP}$$

where $\Delta V$ is typically close to, but not exactly $V_d$, $V^0_{mCNP}$ is the initial $V_{mCNP}$, and a is the doping rate, which depends on the laser's power, wavelength, and position. The black trace in the upper plot of FIG. 3A is the fit for $V_{mCNP}(t)$, with fit parameters $\Delta=8.94$ V, $V^0_{mCNP}=0.34$ V, $a=121$ s⁻¹. In this model, the $V_{mCNP}$ doping rate is $$|dV_{mCNP}(t)/dt|=|\Delta V|a,$$

and the frequency tuning rate is $$R_f=|dV_{mCNP}(t)/dt|df/dV_g=a|\Delta V|df/dV_g,$$

where $df/dV_g$ is the slope of the resonance frequency gate response at $V^0_{mCNP}$. With $|V^0_{mCNP}|\sim5$ V, $df/dV_g$ is typically about 0.75 MHz/V, which with $|\Delta V|\sim1$ V gives $R_f\approx90$ MHz/s. This frequency tuning rate of phototuning is exceptionally fast; for example, it could tune a resonator by a full linewidth is less than 1 ms. We note that this rate is the change in the steady-state $f_V$ for a particular dose, not the dynamic change in $f_V$, which is limited by the RC time constant of the device. The frequency tuning rate is a vital aspect of any NEMS tuning approach. Among many things, the rate dictates the number of devices that can be tuned within a given time and sets limits on feedback control.

Figure 3B:
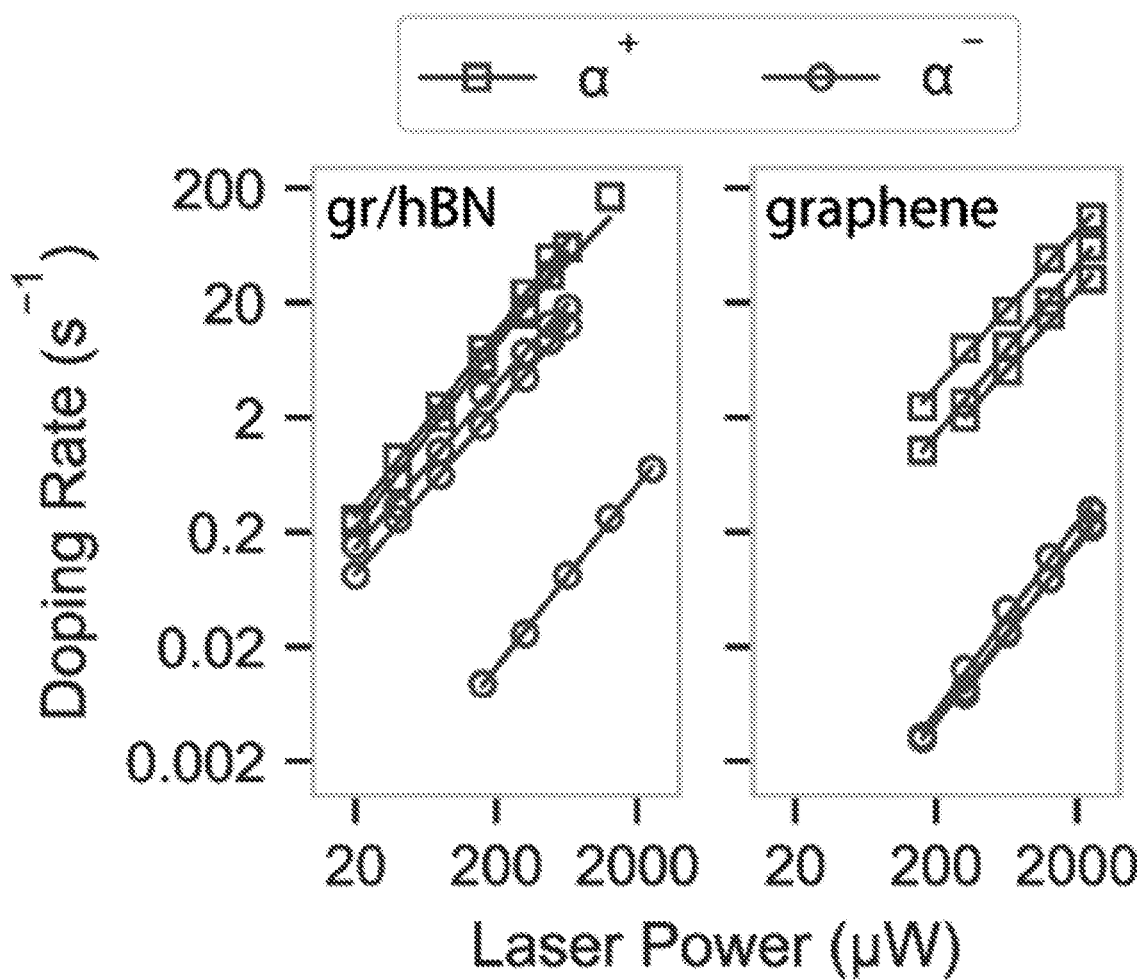
FIG. 3B are graphs showing the doping rate vs. optical power for several gr/hBN and graphene devices, according to an embodiment of the invention.

The photodoping rate increases nonlinearly with optical power. We measure a with optical power ranging from 20-2000 μW. We used a blue doping laser (445 nm) and set $V_d=\pm8$ V. FIG. 3B shows the doping rate vs. optical power for several gr/hBN and graphene devices for powers ranging from 20-2000 μW. The solid lines represent a fit to the function $a=a_0P^\gamma$. These results for graphene/hBN and graphene devices show several features. First, the photodoping rate depends on the value of $V_d$ relative to $V^0_{mCNP}$, with either $V_d<V^0_{mCNP}$ (a⁻ branch) or $V_d>V^0_{mCNP}$ (a⁺ branch). For all devices, a⁺>a⁻, but the difference can vary greatly; for most G/hBN devices, a⁺~2a⁻, while for G devices a⁺~10³×a⁻. The differences in the branch rates could be due to the activation dynamics or concentrations of the photoionized dopants; electron acceptors correspond to the a⁺ branch since the ionized acceptor is negatively charged, but only if they are in the hBN. If the dopants are in the glass, then the a⁺ would be created by electron donors in the glass/Si interface, which leave behind positively charged ions. The similarity in the doping rates of the two branches in gr/hBN devices differs from other studies of the photoelectric memory effect, which found that a⁺~200×a⁻. This difference may be due to a different ratio of donors and acceptors in the CVD monolayer h-BN, compared to exfoliated thick h-BN. For instance, additional carbon defect acceptor states could be introduced in the CVD growth process. It is desirable to have comparable doping rates for the two branches because they allow rapid erasure and feedback g control of the device frequency. Second, both a branches follow a power law relation, $a\sim P^\gamma$, where $\gamma$ is typically close to 1.5; the fits are shown as lines in the FIG. 3B. The power law suggests that phototuning effect is not purely determined by dose, and is potentially due to local laser-induced heating of the Gr/hBN resonators, which lowers the energy barrier between the donors (acceptors) and the conduction (valence) bands. Lastly, a for gr/hBN devices is greater than Gr devices, regardless of branch, although the difference is significantly larger for the a⁻ branch, which can differ by a factor of 10²-10³. This suggests that gr/hBN have a higher density of dopants and/or a lower dopant ionization energy, consistent with previous work. Overall, the a⁺ branch of graphene/hBN devices reached the largest doping rate of ~168 s⁻¹ at 1280 μW and 8 V, which translates to a frequency tuning rate of 1 GHz/s. This high rate of frequency tuning at even modest optical powers means that large arrays of devices could be rapidly tuned and controlled.

Figure 3C:
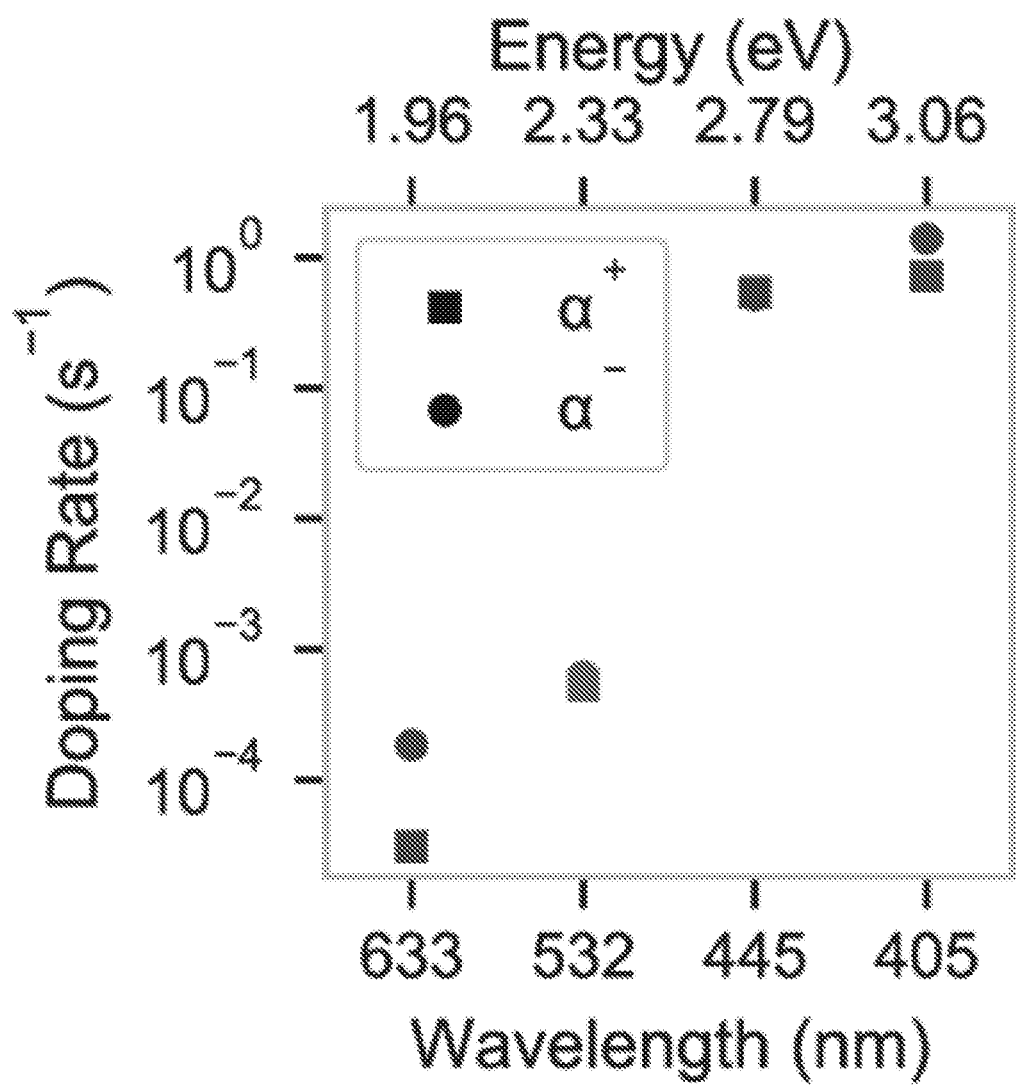
FIG. 3C is a plot showing the tuning rate of a gr/hBN device at different wavelengths, according to an embodiment of the invention.

The phototuning rate is greater for shorter wavelength light. To characterize the wavelength dependence of a, we use four different laser wavelengths (633, 532, 445, 405 nm) with an optical power of 20 μW, and we set $|V_d|=8$ V. FIG. 3C shows the tuning rate, a, of a gr/hBN device, for both the positive and negative branches for 20 μW of 405 nm and 445 nm, 532 nm, and 633 nm illumination. The photodoping rate increases by a factor of 10⁴ from 633 nm to 405 nm illumination. These results show that shorter wavelength, higher energy illumination leads to much faster phototuning. Compared to 633 nm light (a⁺=1.8×10⁻⁴ s⁻¹ and a⁻=3.1× 10⁻⁵ s⁻¹), the a for 405 nm light (a⁺=1.40 s⁻¹ and a⁻=0.72 s⁻¹) was larger by a factor of ~10⁴-10⁵. The rate increase also appears to be saturating near 3 eV. The enhanced phototuning at shorter wavelengths agrees with previous photodoping studies, and is consistent with the depths of a donor nitrogen vacancy (2.8 eV) and an acceptor carbon impurity (2.6 eV). The wavelength dependence of a is advantageous for nanomechanics experiments, as it allows selection of a long-wavelength laser for transduction, which has a negligible phototuning effect, and a short-wavelength laser for phototuning.

Figure 4A:
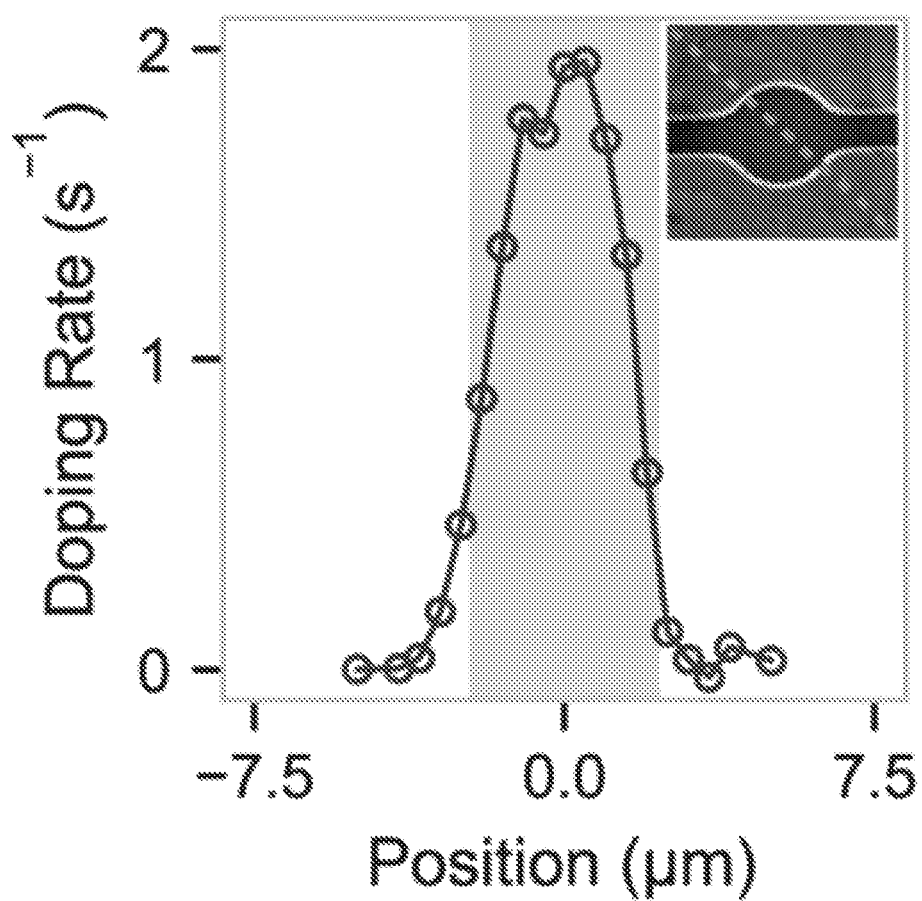
FIG. 4A is a graph showing the photodoping rate as the doping laser is swept across the drumhead, according to an embodiment of the invention.

The spatial resolution of phototuning is diffraction limited, and therefore can locally write/erase individual resonators. To characterize the resolution, we measure a (with $V_d$=8 V) at different spatial locations on a membrane by scanning the photodoping laser (445 nm and 20 µW) over the membrane. FIG. 4A shows the photodoping rate as the doping laser is swept across the drumhead. The doping rate is maximized at the center of the drum and rapidly falls off as it is swept away. FIG. 4A also shows a cross-section of a for a 4.5 µm diameter membrane device (inset); the width of the gray-shaded region is equal to the diameter. When the laser is far from the device, a is nearly zero, showing that phototuning due the defect ionization in surrounding substrate is negligible. As the laser spot begins to overlap with the membrane, a increases rapidly and then reaches a maximum (~2 s$^{-1}$) at the center of the membrane. We estimate the phototuning spatial resolution as $\sigma_p=(FW_\alpha-d_m)/2$, where dm is the membrane diameter and $FW_\alpha$ is the full-width of a. From the data in FIG. 4A, $FW_\alpha$~6.5 µm and $\sigma_p$~1 µm, which is close to the optical diffraction limit. We conclude that the spatial resolution is equal to the laser spot size, in agreement with prior photodoping studies. Rewritable doping in gr/hBN has been demonstrated with other higher resolution, non-optical probes (e.g. STM), which, if they can be applied to our system, could dramatically improve the spatial resolution of our tuning approach.

Figure 4B:
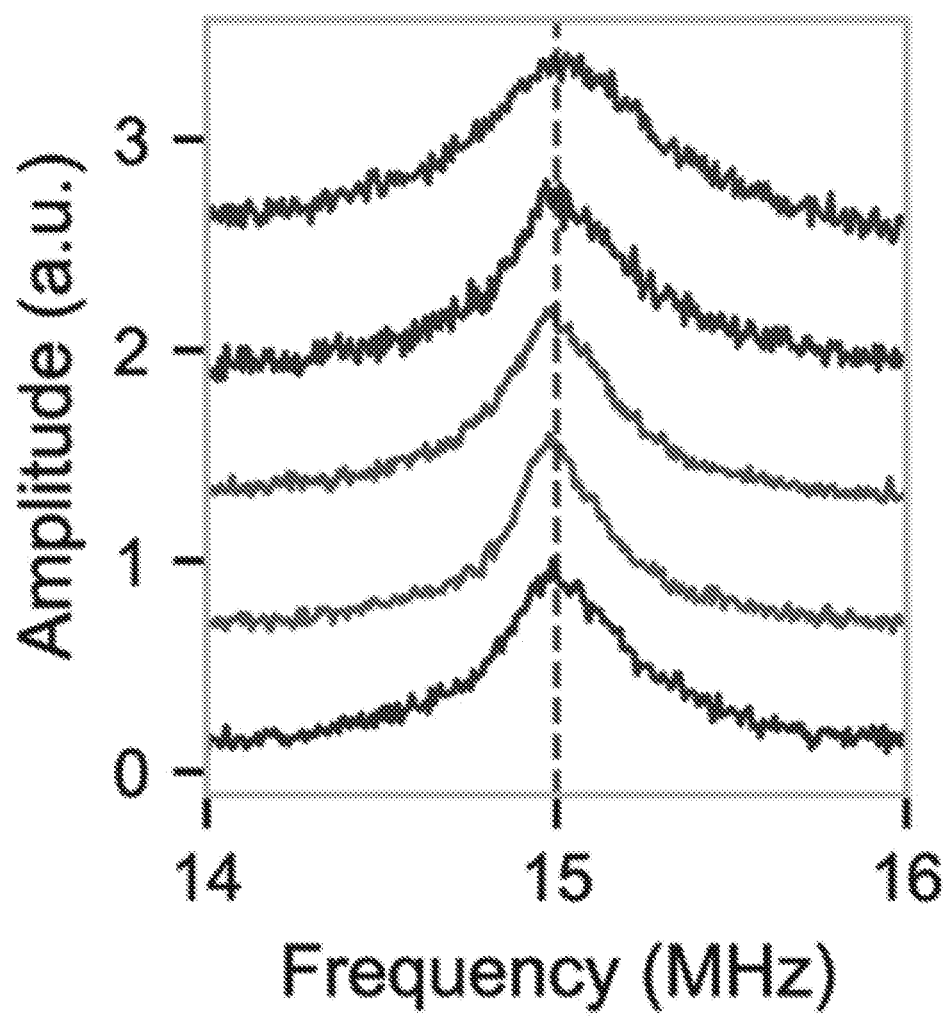
FIG. 4B is a graph showing amplitude spectra for five different Gr/hBN devices, according to an embodiment of the invention.
Figure 4C:
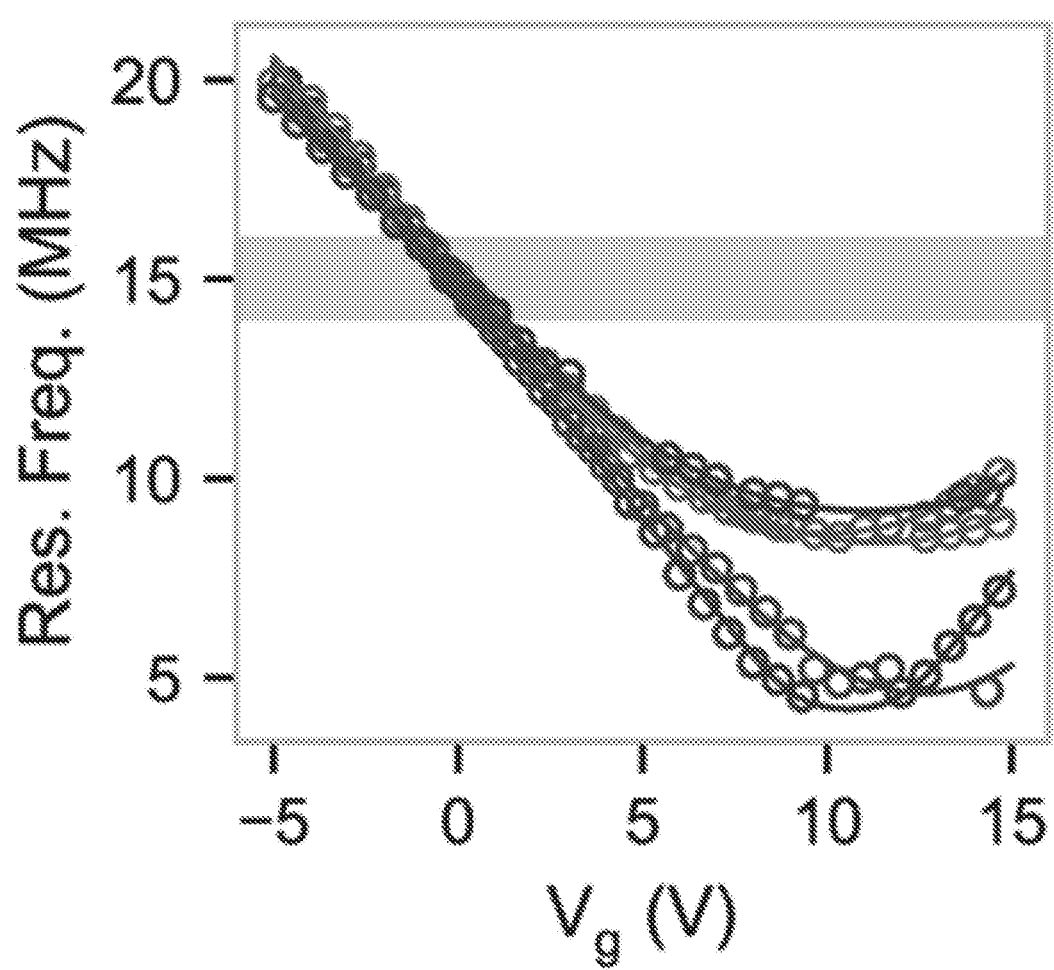
FIG. 4C is a graph of resonance frequency gate curves for several different Gr/hBN devices, according to an embodiment of the invention.

Many applications in NEMS circuits and lattices require precise, programmable frequency and strain tuning of individual resonators within large arrays on a single chip. To demonstrate this capability with phototuning, we align the frequencies of five different Gr/hBN devices to within 30 kHz (or 0.2%) of $f_r$=15 MHz, as shown in the FIG. 4B amplitude spectra, achieving a tuning precision within ~5% of a resonance linewidth. This shows the resonant response for all five devices in a with $V_g$=0 V displaying alignment to 15 MHz of less than 0.2%. The resonance frequency gate curves for each device are shown in FIG. 4C. These are electrostatic tuning curves for the five different resonators simultaneously phototuned to 15 MHz at $V_g$=0 V. All devices display electrostatic tuning of ~0.75 MHz/V far from the charge neutrality point but differ considerably near it. While the curves intersect at $V_g$=0 V (which defines $f_r$) the values of $V_{mCNP}$, $f_{min}$, and the general curve shape vary considerably. This demonstrates that phototuning is a robust method to tune frequency or strain since it is largely insensitive to variations between individual resonators. After ~12 hours, the device frequencies detune slightly but remain within 0.3% to 5% of 15 MHz, which is still within one linewidth from the initial $f_r$. Feedback could be used to correct this detuning drift or to further improve the overall $f_r$ tuning precision. For our system, the feedback control would be ultrafast because the frequency tuning rates can easily exceed ~1 GHz/s. At these high rates, a 1% error could be corrected in about 100 µs. Improved stability would likely be possible at cryogenic temperatures, which would reduce thermally-induced recombination of the ionized defects.

Fabrication of 2D Drumheads 4.5 µm diameter Gr/h-BN mechanical drumhead resonators are fabricated by transferring the 2D sheets over an array of cavities etched into 1 µm wet thermal oxide grown on degenerately doped silicon wafers (University Wafer). The cavities are fabricated using direct-write optical lithography and CHF$_3$ based reactive ion etching. A ~300 nm layer of oxide is left at the bottom of the cavity to act as a charge trapping layer. Ti/Pt electrodes are then evaporated onto the chip.

To make the drumheads, a relatively thick layer (~3 µm) of PMMA A11 is spun onto CVD grown single-layer h-BN on Cu foil (Graphene Supermarket) and then a polyamide scaffold with a central hole removed is then placed on the PMMA/hBN/Cu stack. The stack is placed in a bath of Ammonium Persulphate to etch the Cu and then rinsed in deionized water and dried in air. The polyamide/PMMA/hBN is placed on top of CVD graphene grown on Cu foil (Graphenea) and baked at 180 C for 30 minutes. The etching, rinsing, and drying is repeated leaving a freestanding film of PMMA/hBN/Graphene supported by the polyamide scaffold. The PMMA/hBN/Graphene stack was then placed on top of the pre-patterned cavities and adhered at 155 C overnight (~15 hours). After removing the polyamide scaffold, the PMMA was removed in flowing Ar/H$_2$ at 400 C. The graphene sheet contacts the electrodes from above, resulting in an electrical connection to all devices.

Graphene only devices were fabricated in a similar fashion with both in-house and with a commercial transfer process performed by Graphene.

Measurement of Mechanical Motion

Figure 5:
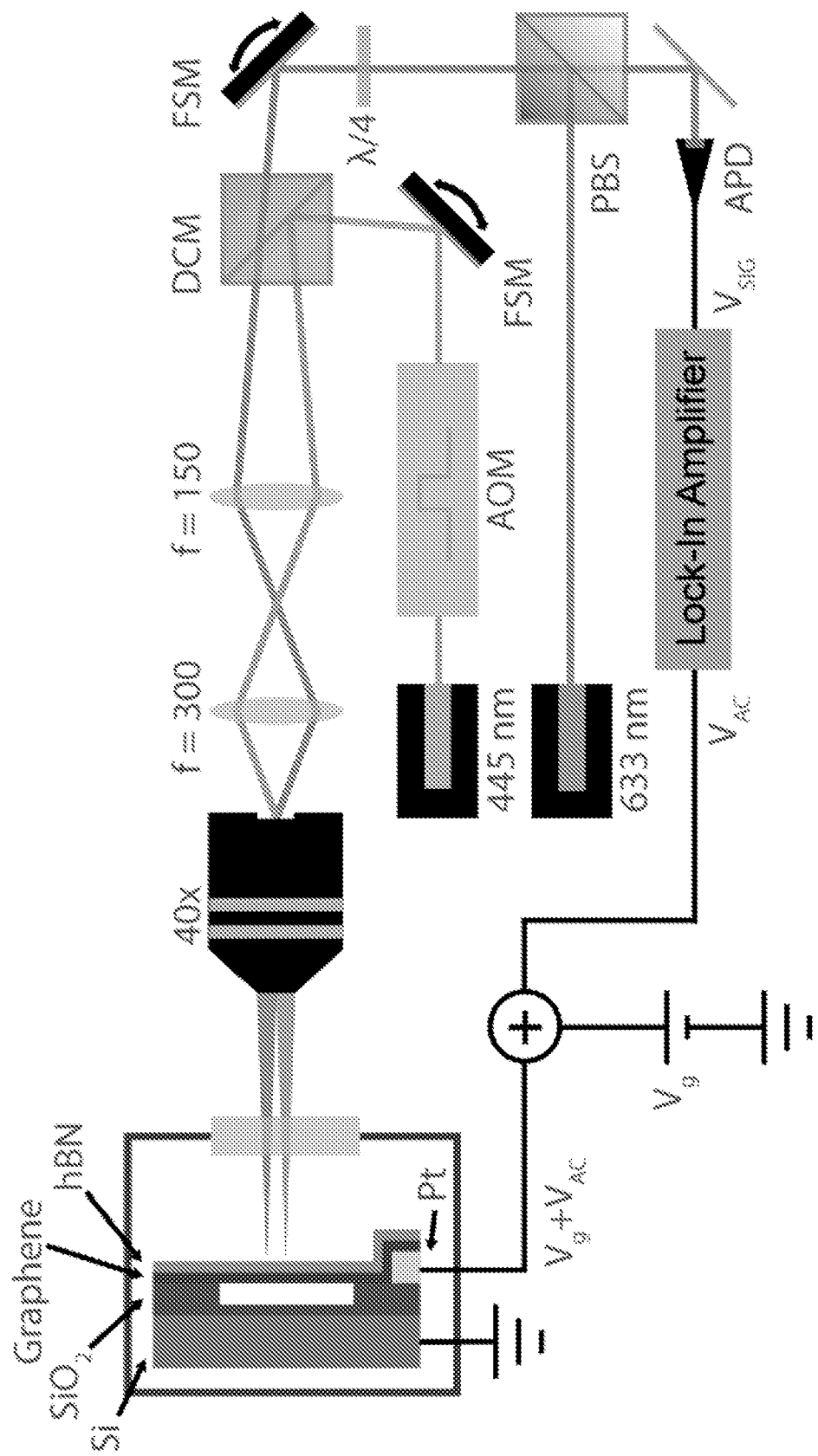
FIG. 5 is a schematic diagram of an optical setup that may be used to implement methods according to embodiments of the present invention.

Device motion was measured using optical interferometry. A 633 nm HeNe laser was focused onto the devices (held at room temperature at 10$^{-6}$ Torr) using a 40×, 0.6 NA objective. The reflected light is detected using a high-sensitivity photodiode (Thorlabs APD 130A). The voltage signal is measured using a Zurich Instruments HFLI2 Lock-In amplifier. The incident laser is scanned with a 2-axis galvometer and passed through an optical relay system in order to verify the mode shape and maximize transduction sensitivity. We use extremely low laser powers (down to 1-10 µW) to avoid unwanted photodoping by the 633 nm probe laser. FIG. 5 illustrates the optical setup, where FSM is a Fast Steering Mirror, PBS is a Polarizing Beamsplitter, λ/4 is a Quarter Waveplate, APD is an Avalanche Photodiode, AOM is a Acousto-Optic Modulator, and DCM is a Dichroic Mirror.

Photodoping

A separate laser (405 nm, 445 nm, or 532 nm) was used for photodoping. The doping laser was coupled into the beam-path using a dichroic mirror and focused onto the sample using the same 40×, 0.6 NA objective lens. A separate 2-axis galvometer was used to position the doping laser in the center of the sample. The laser power for each color was calibrated using a power meter (Thorlabs 120VC) and maintained using PID control. An acousto-optic modulator was used to control the pulse length applied by the doping laser. Dynamic measurement of $V_{mCNP}$ was accomplished with a mechanical feedback technique (see SI). Prior to any dynamic measurement, the doping laser was scanned across the device with $V_d$=0 V to achieve a uniform initial state.

Measurement of the CNP

Measurement of the mechanical charge neutrality point is typically accomplished by fitting the full frequency tuning curves (such as those shown in FIG. 1D), which is too slow for a dynamic measurement of $V_{mCNP}$. To overcome this, we use a mechanical feedback approach, similar to Kelvin Force Probe Microscopy, to rapidly measure $V_{mCNP}$. The electrostatic force felt by the membrane is:

$$F \approx (½)(dC_g/dx)(V_g-V_{mCNP})^2 + V_{AC}(dC_g/dx)(V_g-V_{mCNP})\cos(2\pi ft+\theta)$$

where the first term leads to frequency tuning and the second to electrostatic drive. θ≈0 for low frequencies (100 kHz), below both the RC time constant of the electromechanical circuit (~1 µs) and the mechanical resonance frequency (~0.1 µs). In this regime, the X-quadrature ($X_{quad}$) amplitude measured by the lock-in amplifier is proportional to $(V_g-V_{mCNP})$, which vanishes when $V_g=V_{mCNP}$. This allows us to feedback on $X_{quad}$ with $V_g$ set as the output variable and a set point voltage for $X_{quad}$ of 0 V.

For the dynamic measurements such as those shown in FIG. 3A-3C, our protocol is as follows. First, we set the drive frequency to 100 kHz and turn on the mechanical feedback. After a brief stabilization period, $V_g$ is measured 10 times with the average value giving $V_{mCNP}$. $V_g$ is then fixed at and a short optical pulse is applied to the device to photodope it. This process is repeated until $V_{mCNP}$ approaches $V_d$ with both the laser power and pulse time determining the total length of the measurement.

In another aspect, the invention provides devices and techniques for programmable NEMS crystals, which may be used as central processing units of analog and neuromorphic computers, or in acoustic materials. Platforms include a means to tune the frequencies of each individual cell of the crystal and the coupling between the cells. Our discovery provides a scalable means to achieve this tuning. In our platform, one way to make these crystals is to pattern pillars on a silicon/silicon oxide substrate and transfer graphene to the pillars, like plastic wrap on a bed of nails. The fabrication of the pillars may be done with photo- and e-beam lithography and etching. These crystals can also be made by patterning coupled drumheads. For example, drumheads may be fabricated in an array with graphene ribbons connecting them.

Another application of these NEMS lattices is to metamaterials, which to be effective include a means to shift the frequency (or strain) of a resonator at high speeds. We have achieved this high speed shifting with the nanomechanical bolometer, which can shift at MHz rates. Combining fast frequency shifts with tunable crystals would let us make thermal or acoustic diodes. These diodes would let heat or sound go one way but not the other. These diodes are important to all-mechanical logic and thermal management. No natural material has these properties, but we can make a metamaterial that does. Thus, in combination with optically induced thermomechanical strain, it is feasible to construct dynamic, temporally modulated phononic crystals for novel metamaterial properties like non-reciprocal or topologically protected phonon transport.

In another aspect, the inventors envision patterning arbitrary complex geometries of static charge across a single, large-area resonator. Such applications are similar to the programmable NEMS crystals, giving an alternative means to make the crystal. The crystal would have patterned strain, instead of patterned resonators.

In another aspect, the inventors envision that phototuned resonators may be used to build widely tunable bandpass filters. A resonator will absorb energy near the resonance frequency. So, the resonator will filter out signals near the resonance frequency, acting as a notch filter. The bandwidth of the notch filter is given by the linewidth of the resonator. The center frequency in our system is tunable. We have demonstrated a range of 7-45 MHz, but it is preferable to limit the frequency tuning voltage to 35 Volts just to be safe and not damage the devices. Embodiments may safely tune to 80-100 V and achieve a upper range near 100 MHz.

This technique provides a method of specifying the mechanical resonance frequency in a re-writable fashion for multiplexed transduction. In many NEMS applications, multiplexed readout is required and is typically achieved via changing the geometry of the NEMS. In our implementation, the resonant frequency is tuned after initial fabrication. First, the resonant frequency on all devices in an array is measured and the dose required to tune the resonance frequency using the aforementioned method is determined. Then, each device has its frequency tuned using the phototuning method until it is at the desired frequency. This frequency can be identical for all devices or spaced in a "comb" to allow discrimination of each devices.

This technique provides a method for offsetting frequency drift to do irreversible processes such as mass adsorption. The frequency in NEMS oscillators is known to detune with time. The phototuning method can offset this detuning. First, the resonant frequency is set to a desired value. To implement this, the frequency is periodically measured and the phototuning approach is used to restore the initial frequency.

Phototuning offers intriguing possibilities for both applied and fundamental physics in NEMS and NEMS arrays, where tight control over individual resonators is essential. Our technique can pattern arbitrary complex geometries of static charge across a single, large-area resonator, which could improve the actuation efficiency of antisymmetric modes or allow tunable intermodal coupling, both commonly achieved via intricately patterned back-gates. Charge patterning could also enable electrostatic phononic crystals or new mechanisms for nanomechanical read-out by straining a suspended, photodoped p-n junction. Although conventional electrostatic back-gating is not easily scalable, phototuning provides a means to tune large arrays and lattices of 2D NEMS resonators, while only employing a single global back-gate and a single metallic top-contact. The spacing of individual resonators in these arrays is determined by the spatial resolution of phototuning (~1 μm in our setup), so highly dense arrays are possible. Due to the high tuning rates (~GHz/s), phototuning can rapidly program and control these dense arrays. For instance, at a GHz/s an array of 10,000 Gr/hBN NEMS can be uniformly tuned by a linewidth ($f_r$/Q~100 kHz) in 1 second, which is a small fraction of the detuning time (~40 hours), and corrections on the order of the frequency noise for the array would take ~1 ms. Even faster tuning control should be possible with higher laser powers because of the thermal stability of graphene and h-BN.

Precisely tuned resonator arrays will have many new applications, including spatially resolved imaging or multiplexed sensing for force, charge, or mass spectrometry. An array can serve as a new type of photodetector array similar to a CCD, where a projected optical image could be recorded by measuring the cumulative frequency shift of each array element. The persistence and large tuning range of phototuning combined with an array would permit high-density memory storage, where information is encoded in the frequency of each resonator. If each memory state is separated by a resonance linewidth (~100 kHz), the tuning range demonstrated in FIG. 2A would accommodate ~543 states, which is equivalent to a 9-bit memory with a lifetime of ~40 hours. In this way, the areal bit density of an array would exceed a Gbit/in$^2$. The density could be greatly improved by reducing the frequency binning to a level closer to the frequency noise, which is typically ~100 Hz at room temperature. For example, a bin of 1 kHz would yield a bit density of ~100 Gbit/in$^2$, a value exceeding modern optical media by 10×. This tuning also offers new opportunities for programmable NEMS crystals. In our vision for these crystals, individual Gr/hBN or Gr resonators would be coupled to neighboring resonators by a suspended bridge of Gr/hBN or Gr. By phototuning the resonators and the bridges, precisely tuned complex acoustic crystals would possible. Unlike previous demonstrations of static phononic crystals and tunable phononic crystals, our approach is not vulnerable to fabrication imperfections and possesses a higher degree of tunability and the ability to modify individual unit cells of the crystal. Altogether, our phototuning platform would enable fully programmable NEMS crystals complete with control over acoustic bandgaps, defects, and patterning of acoustic cavities and waveguides. These crystals could serve as a platform to study solid-state physics or explore novel topological metamaterial properties, on-chip phononics, or in mechanical implementations of logic and neuromorphic computing.

We have demonstrated the phototuning effect in Gr/hBN and Graphene, but the effect may also work with other materials. In our description of the phototuning effect, laser light ionizes dopants, which then electrostatically strain and shift the frequency of the suspended resonator. The photoionization of defects—or photodoping—creates localized trapped charge in the insulating material that is near the graphene. This trapped charge has been observed to modulate the electronic properties in a variety of graphene systems, including the heterostructures used in this work h-BN and $SiO_2$, other thin dielectric layers, and $TiO_x$, and $SiO_2$. In our mechanical system, the trapped charge applies an electrostatic force on the graphene, which shifts its frequency and the $V_{mCNP}$. In accord with the photodoping picture, the frequency shift is determined by the doping potential and the dose. Moreover, the total charge begins to neutralize under an applied bias, and the force vanishes completely when $V_g \sim V_{mCNP}$. Because we have observed phototuning in both graphene and gr/hBN, the locally trapped charge can reside in the hBN and the oxide/silicon interface. However, photodoping rates are much faster in the gr/hBN heterostructure. Phototuning could be used in a variety of systems which undergo photoinduced doping, such as $SrTiO_3$, graphene/dielectric layers, or other graphene based 2D heterostructures. In these systems, the mechanical element does not need to be graphene or an atomically-thin graphene hybrid. For example, graphene-coated silicon nitride nanobeams could be persistently tuned but would retain ultrahigh quality factors of $Q>10^6$, allowing for an extremely dense analog memory. However, the advantage of atomically-thin resonators will be an extreme tuning range.

In conclusion, we have used a combination of optical illumination and gate biasing—phototuning—to locally (~1 μm) and rapidly (>1 GHz/s) tune the frequency of individual graphene and graphene/hBN nanomechanical resonators. We tune the frequency precisely (~0.1%) and freely across a broad range (>550%), and we observe the tuning—in the absence of any external bias or power—is long-lived, persisting for at least several days. Altogether, our phototuning platform acts as a rewritable, non-volatile NEMS memory, and provides a much-needed frequency tuning method for NEMS resonators that is both reversible and persistent, and which is easily scalable to arbitrarily large, dense resonator arrays. More generally, phototuning is useful for patterning local strain. By removing the need for patterned gate electrodes, phototuning enables sophisticated electrostatic force landscapes in NEMS that are otherwise impossible to realize. Coupled NEMS resonators, for example, are challenging to study because they require close spacing and tunable frequencies and coupling, both of which are easily accomplished with phototuning. Similarly, phototuning opens the door to advanced NEMS resonator networks. Phototuned resonators can be used to build many valuable network components like widely tunable bandpass filters, high-density analog memories, and acoustic waveguides. Furthermore, our platform makes both the node coupling and the nodes of the network programmable, which would enable programmable phononic crystals for tunable phononic cavities, tunable thermal transport, or a potential framework for mechanical analog logic and computing. In combination with optically induced thermomechanical strain, it would be feasible to construct dynamic, temporally modulated phononic crystals for novel metamaterial properties like non-reciprocal or topologically protected phonon transport.

The invention claimed is:

1. A method of storing a multi-state value in a nano-electromechanical systems (NEMS) drum device, the method comprising:
   applying a gate voltage between a drum membrane and a back gate to alter the resonant frequency of the membrane to a desired frequency;
   photoionizing the drum membrane with a laser to detune the membrane resonant frequency to a ground state frequency;
   releasing the gate voltage to set the membrane to the desired resonant frequency.

2. The method of claim 1 wherein photoionizing the drum membrane is performed while the gate voltage continues to be applied between the drum membrane and the back gate.

3. The method of claim 1 wherein the nano-electromechanical systems (NEMS) drum device comprises a graphene/hBN membrane suspended on a $SiO_2$ layer deposited on a Si substrate.

4. The method of claim 1 further comprising measuring the drumhead resonance frequency via optical interferometry to read the desired resonant frequency to which the membrane is set.

5. The method of claim 1 further comprising setting the gate voltage to zero and illuminating the drum membrane with a laser to reset the drum device.

6. The method of claim 1 wherein the nano-electromechanical systems (NEMS) drum device is an element of an array of nano-electromechanical systems (NEMS) drum devices.

7. A method for photodetection of light with a nanoelectromechanical (NEMS) resonator, the method comprising:
   applying a gate voltage between the drum membrane and a back gate,
   exposing the membrane to laser light to produce photoionization of the drum membrane such that a resulting charge alters the membrane resonant frequency,
   turning off the laser light and releasing the gate voltage to set the resonant frequency of the membrane to a predetermined frequency;
   exposing the drum membrane to the light to produce photoionization of the drum membrane such that a resulting charge alters the membrane resonant frequency;
   measuring the drumhead resonance frequency and comparing it to the predetermined frequency to determine total accumulated exposure of the drumhead to the light.

8. The method of claim 7 wherein exposing the membrane to laser light is performed while the gate voltage continues to be applied between the drum membrane and the back gate.

9. The method of claim 7 further comprising setting the gate voltage to zero and illuminating the drum membrane with a laser to reset the drum device.

10. The method of claim 7 wherein the nano-electromechanical systems (NEMS) drum device is an element of an array of nano-electromechanical systems (NEMS) drum devices.

* * * * *